(12) United States Patent
Sakamoto et al.

(10) Patent No.: US 12,211,764 B2
(45) Date of Patent: Jan. 28, 2025

(54) SEMICONDUCTOR DEVICE AND METHOD OF MANUFACTURING THE SAME

(71) Applicant: Mitsubishi Electric Corporation, Tokyo (JP)

(72) Inventors: Ken Sakamoto, Tokyo (JP); Keitaro Ichikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 410 days.

(21) Appl. No.: 17/836,155

(22) Filed: Jun. 9, 2022

(65) Prior Publication Data

US 2023/0163037 A1 May 25, 2023

(30) Foreign Application Priority Data

Nov. 25, 2021 (JP) .................. 2021-191511

(51) Int. Cl.
*H01L 23/31* (2006.01)
*H01L 21/48* (2006.01)
(Continued)

(52) U.S. Cl.
CPC ...... *H01L 23/3107* (2013.01); *H01L 21/4842* (2013.01); *H01L 21/561* (2013.01);
(Continued)

(58) Field of Classification Search
CPC ........... H01L 23/3107; H01L 23/49575; H01L 23/295; H01L 23/49513; H01L 23/49555; H01L 23/49568; H01L 23/49582; H01L 23/49586; H01L 21/4842; H01L 21/561; H01L 21/565; H01L 24/29; H01L 24/32; H01L 24/45; H01L 24/48; H01L 24/49; H01L 24/73; H01L 25/16; H01L 2224/29339; H01L 2224/32245; H01L 2224/45124; H01L 2224/45139;
(Continued)

(56) References Cited

U.S. PATENT DOCUMENTS 9,716,072 B2 * 7/2017 Kawashima .......... H01L 21/565
2017/0294369 A1 10/2017 Kawashima et al.
2022/0293434 A1 9/2022 Iwai et al.

FOREIGN PATENT DOCUMENTS

JP H03-036141 U 4/1991
JP H05-005220 U 1/1993
(Continued)

OTHER PUBLICATIONS

Office Action issued in DE 10-2022-119-856.1; mailed by the German Patent and Trademark Office on Aug. 31, 2024.

*Primary Examiner* — Tu-Tu V Ho
(74) *Attorney, Agent, or Firm* — Studebaker & Brackett PC

(57) ABSTRACT

The third side surface includes inclined surfaces inclined in a direction in which a center in an up-down direction of the third side surface is convex. The mold resin further includes a residual section provided in the center of the third side surface and a dowel section provided between the inclined surface and the residual section. The dowel section projects further in a lateral direction than the inclined surface. The residual section further projects in the lateral direction than the dowel section and has a fracture surface perpendicular to the up-down direction.

8 Claims, 10 Drawing Sheets

(51) Int. Cl.
*H01L 21/56* (2006.01)
*H01L 23/495* (2006.01)
*H01L 25/16* (2023.01)
*H01L 23/00* (2006.01)
*H01L 23/29* (2006.01)

(52) U.S. Cl.
CPC ...... *H01L 21/565* (2013.01); *H01L 23/49575* (2013.01); *H01L 25/16* (2013.01); *H01L 23/295* (2013.01); *H01L 23/49513* (2013.01); *H01L 23/49555* (2013.01); *H01L 23/49568* (2013.01); *H01L 23/49582* (2013.01); *H01L 23/49586* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/29339* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48101* (2013.01); *H01L 2224/48105* (2013.01); *H01L 2224/48137* (2013.01); *H01L 2224/48245* (2013.01); *H01L 2224/49505* (2013.01); *H01L 2224/73253* (2013.01); *H01L 2924/10254* (2013.01); *H01L 2924/10272* (2013.01); *H01L 2924/1033* (2013.01); *H01L 2924/12032* (2013.01); *H01L 2924/13055* (2013.01); *H01L 2924/13091* (2013.01); *H01L 2924/14* (2013.01)

(58) Field of Classification Search
CPC . H01L 2224/45144; H01L 2224/45147; H01L 2224/48101; H01L 2224/48105; H01L 2224/48137; H01L 2224/48245; H01L 2224/49505; H01L 2224/73253
USPC ........................................................ 257/239
See application file for complete search history.

(56) References Cited

FOREIGN PATENT DOCUMENTS

| | | |
|---|---|---|
| JP | 2001-085454 A | 3/2001 |
| WO | 2016/072012 A1 | 5/2016 |
| WO | 2021-070677 A1 | 4/2021 |

* cited by examiner

SEMICONDUCTOR DEVICE AND METHOD OF MANUFACTURING THE SAME

BACKGROUND OF THE INVENTION

Field

The present disclosure relates to a semiconductor device and a method of manufacturing the same.

Background

A semiconductor device of a type in which an energization path is set in a longitudinal direction of the device in order to cope with high-voltage and large-current power control is generally called a power semiconductor device. Examples of the power semiconductor device include an IGBT (Insulated Gate Bipolar Transistor), a MOSFET (Metal Oxide Semiconductor Field Effect Transistor), a bipolar transistor, and a diode.

A semiconductor device in which the power semiconductor device is mounted on a circuit board and sealed by sealing resin is used in a wide range of fields such as industrial equipment, automobiles, and railways. In recent years, there has been an increasing demand for high performance of a semiconductor device such as increases in a rated voltage and a rated current and a reduction in size according to improvement of performance of equipment equipped with the semiconductor device.

There is a mold sealing type as a package structure of a semiconductor device. In the mold sealing type, a semiconductor device is mounted on a lead frame and the semiconductor device and a lead frame terminal are bonded by wire bonding and sealed by epoxy resin. As a method of manufacturing the semiconductor device, transfer molding for clamping the lead frame with an upper die and a lower die and injecting the epoxy resin into a cavity is generally used. After molding, a lead projecting from a package side surface is cut by a punch (see, for example, Japanese Unexamined Utility Model Application Publication No. H5-5220) and the cut lead is bent to form an electrode.

As a molding method with high productivity, there is generally known a multiple row mold resin injection process for injecting, in order, mold resin into a plurality of cavities connected to one another by runners. Since the resin in the portions of the runners is unnecessary, the resin is punched by resin cutting and removed. After the resin cutting, a residual section having a fracture surface perpendicular to the up-down direction remains on a side surface of the mold resin.

SUMMARY

In a both-end supported runner, to both ends of which semiconductor devicees are respectively coupled, shearing stress is applied to both ends of resin in the portions of runners at resin cutting. Therefore, a load of only half of a resin cutting press capacity is applied to one end. Therefore, there is a problem that a crack occurs in a molded section from the root of the residual section after the resin cutting.

The present disclosure has been made in order to solve the problem described above and an object of the present disclosure is to obtain a semiconductor device and a method of manufacturing the semiconductor device that can prevent a crack failure.

A semiconductor device according to the present disclosure includes: a semiconductor chip; a lead terminal connected to the semiconductor chip; and insulative mold resin sealing the semiconductor chip and a part of the lead terminal, wherein the mold resin includes a mold forming section having first and second side surfaces opposed to each other and a third side surface different from the first and second side surfaces, the lead terminal projects from the first and second side surfaces, the third side surface includes inclined surfaces inclined in a direction in which a center in an up-down direction of the third side surface is convex, the mold resin further includes a residual section provided in the center of the third side surface and a dowel section provided between the inclined surface and the residual section, the dowel section projects further in a lateral direction than the inclined surface, and the residual section further projects in the lateral direction than the dowel section and has a fracture surface perpendicular to the up-down direction.

In the present disclosure, the dowel section is provided between the inclined surface and the residual section on the third side surface of the mold resin. Consequently, even if the punch comes into contact with the dowel section at resin cutting, the dowel section is only broken as a dummy. The crack does not occur in the mold forming section of the mold resin. Position accuracy of the punch is improved by performing the resin cutting with the dowel section as a mark. As a result, a crack failure can be prevented.

Other and further objects, features and advantages of the invention will appear more fully from the following description.

DESCRIPTION OF EMBODIMENTS

A semiconductor device and a method of manufacturing the same according to the embodiments of the present disclosure will be described with reference to the drawings. The same components will be denoted by the same symbols, and the repeated description thereof may be omitted.

First Embodiment

Figure 1:
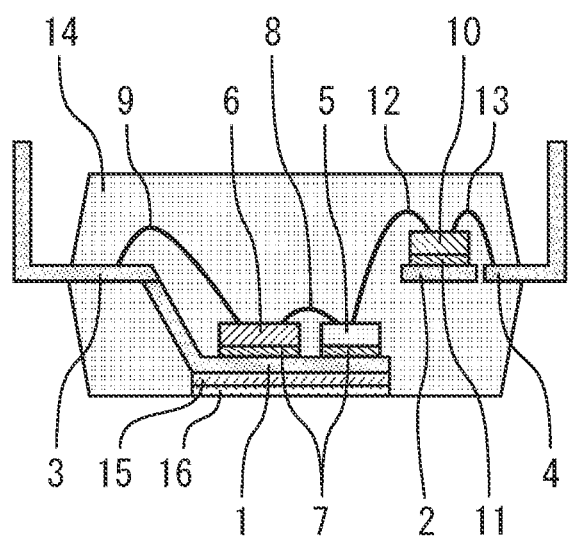
FIG. 1 is a sectional view illustrating a semiconductor device according to a first embodiment.

FIG. 1 is a sectional view illustrating a semiconductor device according to a first embodiment. Die pads 1 and 2, a power terminal 3, and an IC terminal 4 are formed from a lead frame made of copper or a copper alloy and are separated from one another. The height of the die pad 2 is the same as the height of a framework of an device outer peripheral section. The die pad 1 is provided below the die pad 2 by frame bending. The thickness of the lead frame is set according to a value of an electric current flowing to a terminal during actual use, and is set to 0.1 mm to 1 mm in order to stably manufacture the lead frame by press working.

Lower surface electrodes of semiconductor chips 5 and 6 are bonded to the die pad 1 by solder 7. The semiconductor chip 5 is an IGBT but may be a MOSFET. The semiconductor chip 6 is a diode but may be a Schottky barrier diode.

Upper surface electrodes of the semiconductor chips 5 and 6 are connected to each other by a power wire 8. The upper surface electrode of the semiconductor chip 6 is connected to the power terminal 3 by a power wire 9. The power wires 8 and 9 are bonded to the power terminal 3 and the upper surface electrodes of the semiconductor chips 5 and 6 using an ultrasonic bonding device. As the material of the power wires 8 and 9 to which a large current flows, Al that has electric conductivity not so high as the electric conductivity of Ag but is inexpensive is selected. The diameter of the power wires 8 and 9 is 0.1 to 0.5 mm.

An IC (Integrated Circuit) element 10 is bonded to the die pad 2 by Ag paste 11. The AG paste 11 is hardened by an oven. A gate electrode on the upper surface of the semiconductor chip 5 is connected to the IC element 10 by an IC wire 12. The IC element 10 is connected to the IC terminal 4 by an IC wire 13. The IC element 10 controls the semiconductor chip 5 according to a signal input from the IC terminal 4. As the material of the IC wires 12 and 13, a material having high electric conductivity such as gold, silver, or copper is selected. The IC wires 12 and 13 are finely machined into a diameter equal to or smaller than 0.05 mm and formed into balls by a spark to be bonded to a small pad of the IC element 10.

The semiconductor chips 5 and 6, the die pads 1 and 2, parts of the power terminal 3 and the IC terminal 4, and the like are sealed by insulative mold resin 14. The mold resin 14 is resin obtained by filling silicon dioxide (SiO2) in thermosetting epoxy resin as a filler to bring a coefficient of linear expansion close to the coefficient of linear expansion of copper.

An insulating film 15 and a metal foil 16 are provided on the lower surface of the die pad 1 as an insulating radiating material. The metal foil 16 is exposed from the lower surface of the mold resin 14. The insulating radiating material is not limited to this and may be the mold resin 14. Alternatively, the insulating radiating material may be a sheet body of epoxy resin having thickness of 0.1 mm to 0.3 mm filled with aluminum nitride (AlN), boron nitride (BN), or silicon dioxide ($SiO_2$), which is a high heat radiation filler. Alternatively, the insulating radiating material may be a DBC (Direct Bonded Copper) substrate, an AMB (Active Metal Brazing) substrate, or a DBA (Direct Bonded Aluminum) obtained by combining high heat radiation insulating materials such as aluminum nitride, silicon nitride ($Si_3N_4$), and silicon dioxide. Consequently, it is possible to further improve heat dissipation while maintaining insulation.

Figure 2:
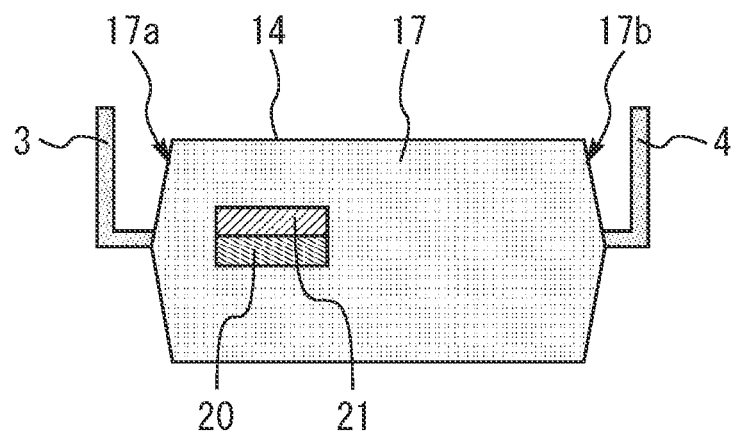
FIG. 2 is a side view illustrating the semiconductor device according to the first embodiment.
Figure 3:
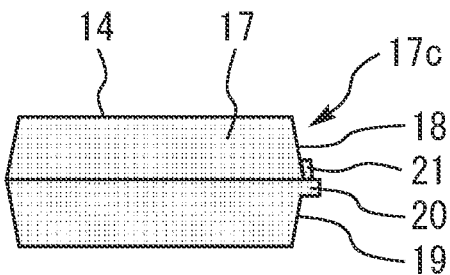
FIG. 3 is a side view illustrating the semiconductor device according to the first embodiment.

FIGS. 2 and 3 are side views illustrating the semiconductor device according to the first embodiment. The mold resin 14 includes a mold forming section 17 incorporating the semiconductor chips 5 and 6 and the like. The mold forming section 17 includes a first side surface 17a and a second side surface 17b opposed to each other and a third side surface 17c different from the first and second side surfaces. FIG. 2 is a side view of the semiconductor device viewed from a direction perpendicular to the third side surface 17c. In order to electrically connect the semiconductor device to the outside, the power terminal 3 and the IC terminal 4 respectively project from the first side surface 17a and the second side surface 17b.

FIG. 3 is a side view of the semiconductor device viewed from a direction perpendicular to the first side surface 17a. In FIG. 3, illustration of a lead terminal is omitted for simplification of explanation. The third side surface 17c includes, in upper and lower parts thereof, inclined surfaces 18 and 19 inclined in a direction in which the center in the up-down direction of the third side surface 17c is convex. The mold resin 14 further includes a residual section 20 provided in the center of the third side surface 17c and a dowel section 21 provided between the inclined surface 18 and the residual section 20. The residual section 20 is a cutting remainder after resin cutting explained below. The dowel section 21 projects further in the lateral direction than the inclined surface 18 and is inclined in a direction in which the dowel section 21 is convex toward the residual section 20. The residual section 20 further projects in the lateral direction than the dowel section 21 and has a fracture surface perpendicular to the up-down direction. The fracture surface of the residual section 20 is a square, one side of which is several micrometers to several hundred micrometers.

Figure 4:
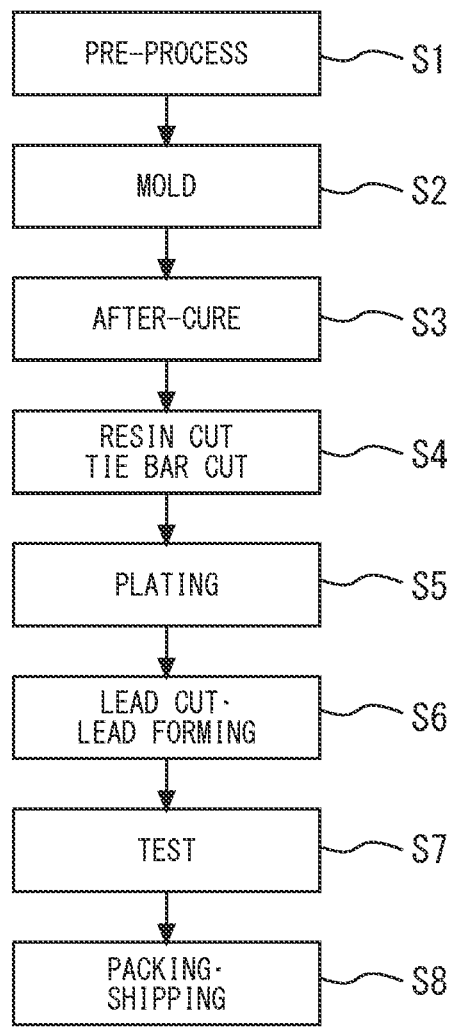
FIG. 4 is a flowchart of the method of manufacturing the semiconductor device according to the first embodiment.
Figure 5:
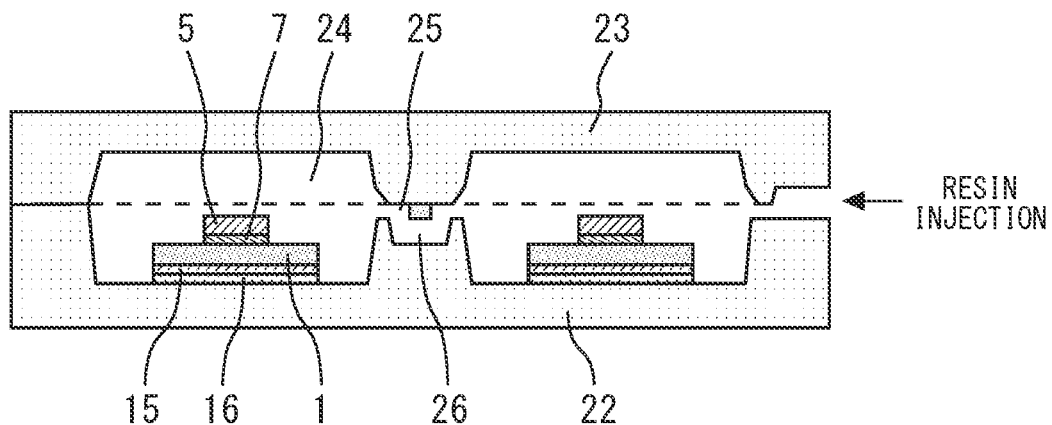
FIG. 5 is a sectional view illustrating the method of manufacturing the semiconductor device according to the first embodiment.
Figure 6:
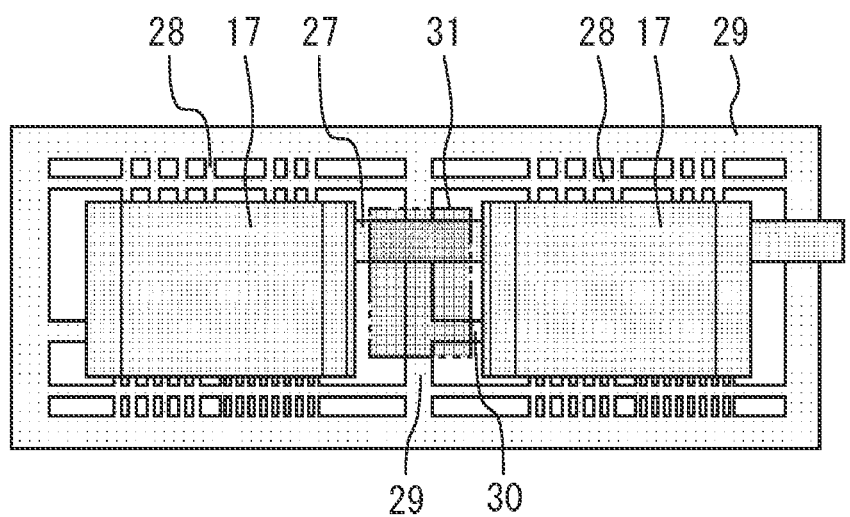
FIG. 6 is a top view illustrating the method of manufacturing the semiconductor device according to the first embodiment.
Figure 7:
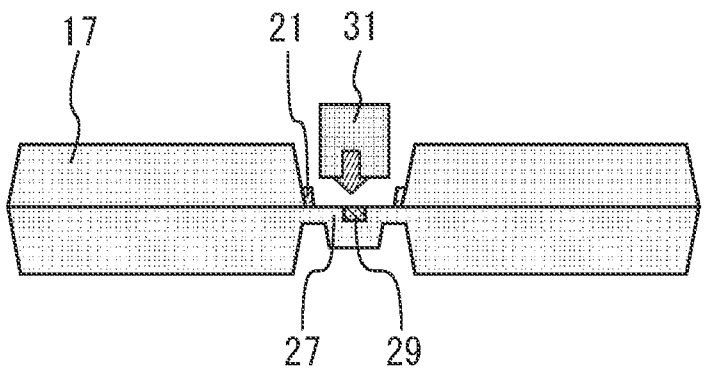
FIG. 7 is a sectional view illustrating the method of manufacturing the semiconductor device according to the first embodiment.
Figure 8:
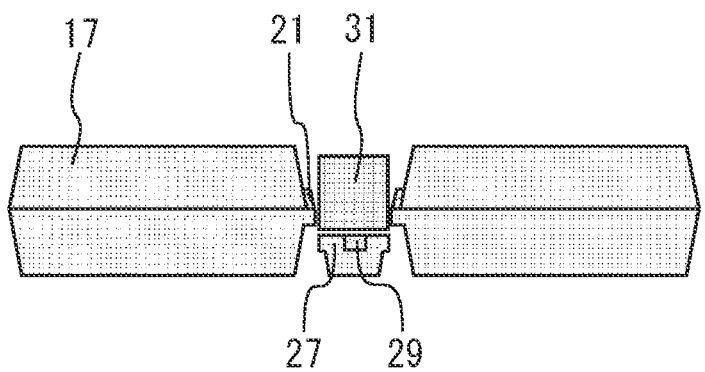
FIG. 8 is a sectional view illustrating the method of manufacturing the semiconductor device according to the first embodiment.
Figure 9:
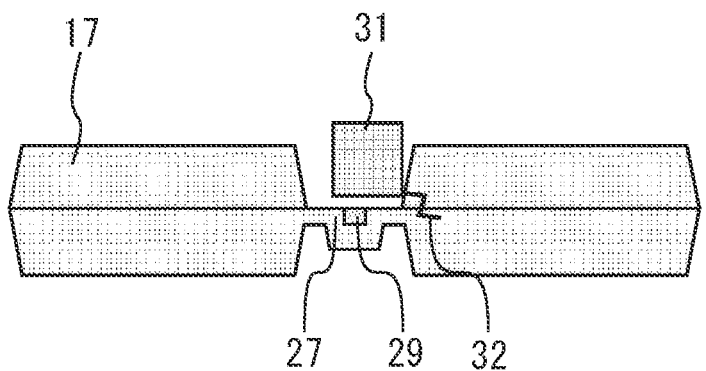
FIG. 9 is a side view illustrating a method of manufacturing a semiconductor device according to the comparative example.

Next, a method of manufacturing the semiconductor device according to this embodiment will be explained. FIG. 4 is a flowchart of the method of manufacturing the semiconductor device according to the first embodiment. FIGS. 5, 7, and 8 are sectional views illustrating the method of manufacturing the semiconductor device according to the first embodiment. FIG. 6 is a top view illustrating the method of manufacturing the semiconductor device according to the first embodiment. In FIGS. 8 and 9, illustration of the internal structure of the semiconductor device is omitted for simplification of explanation.

First, as a pre-process, the semiconductor chips 5 and 6 are mounted on a lead frame connected to the die pads 1 and 2, the power terminal 3, and the IC terminal 4 and wire bonding is performed (step S1). Subsequently, the lead frame is heated and expanded on a hot plate in advance and mounted on framework positioning holes of a lower die 22 on the left and the right of a pot row. Next, tablet-like mold resin 14, which is thermosetting resin, is put in pot sections of the lower die 22. An upper die 23 and the lower die 22 are clamped. Consequently, as illustrated in FIG. 5, the semiconductor chips 5 and 6, the power terminal 3, the IC terminal 4, and the like are disposed in each of a plurality of cavities 24 formed between the upper die 23 and the lower die 22. Gates of the cavities 24 adjacent to each other are connected to each other by a runner 25. A resin pool section 26 is provided below the runner 25. The runner 25 is a gap formed between the upper die 23 and the lower die 22 and is a resin passage. The resin pool section 26 is provided in order to improve mold resin strength and prevent the resin from sticking to a die at release.

A plunger chip inside a pot is raised to melt the mold resin 14 to minimum melting viscosity. High hydrostatic pressure of 5 to 15 MPa is applied by the plunger chip to inject the mold resin 14 into the cavities 24 from a cull section of the mold die. The mold resin 14 is supplied to the plurality of cavities 24 in order via the runner 25 to seal the semiconductor chip 5, the lead frame, and the like (step S2). Consequently, two or more lead frames can be transfer-molded at a time by one mold die. Continuously molding a plurality of semiconductor devicees in this way is called multiple row molding. This sealing method is a sealing method having high quality and high productivity with which a void is less easily formed in the mold forming section 17.

Subsequently, the mold resin 14 is heated as it is and hardened. The clamped upper and lower dies 23 and 22 are opened and, at the same time, ejector pins and plunger chips of the upper die 23 and the lower die 22 are projected to release the mold forming section 17 from the upper die 23 and the lower die 22. The lead frame including the semiconductor device and the cull is taken out from the lower die 22. The cull is gate-broken (cut) and separated from a lead frame 28 including the semiconductor device.

At this stage, as illustrated in FIG. 6, the mold forming sections 17 of the plurality of semiconductor devicees are connected via the mold resin 27 in the portion of the runner 25 and the resin pool section 26. The lead frames 28 of the semiconductor devices adjacent to each other are connected by a framework 29. In the lead frame 28, the die pads 1 and 2, the power terminal 3, the IC terminal 4, and a lead 30 are connected by the framework 29.

Subsequently, the mold forming section 17, which has not been able to completely harden in the mold die, is baked and after-cured in the oven to be completely hardened (step S3). A heater power supply of the oven is cut and the lead frame 28 including the semiconductor device is cooled to the air temperature to increase a modulus of elasticity of the mold forming section 17.

Next, in order to remove an unnecessary portion of the mold forming section 17, as illustrated in FIGS. 7 and 8, the mold resin 27 in the portion of the runner 25 and the resin pool section 26 is punched from the upper surface side by a punch 31. The residual section 20 is left on the third side surface 17c of the mold forming section 17 by this resin cutting. In order to remove a tie bar applied to the lead frame 28 for burr avoidance for the mold forming section 17, the tie bar is punched by a tie bar cut die (step S4).

Subsequently, plating of tin or tin copper or electroplating of benzotriazole (1,2,3-benzotriazole, BTA), which is an antioxidant film, or the like is applied to the surface of the lead frame 28 (step S5). Consequently, it is possible to prevent deterioration of the surface of the lead frame 28 such that the lead frame 28 can be stored for a long period under a high-temperature and high-humidity environment.

The framework 29 is punched by a lead cut die in order to remove an unnecessary framework from the lead frame 28 including the semiconductor device. The power terminal 3 and the IC terminal 4 drawn out to the outside are bent in a package upper surface direction by a lead forming die (step S6). A test for electric characteristics and an exterior of the semiconductor device is performed (step S7). A completed semiconductor device is packed and shipped (step S8).

Next, effects of this embodiment and a comparative example will be explained in comparison. FIG. 9 is a side view illustrating a method of manufacturing a semiconductor device according to the comparative example. In the comparative example, the dowel section 21 is not provided.

Here, a flash burr occurs between the mold forming section 17 and the tie bar without being completely clamped by the upper die 23 and the lower die 22. A thick burr equivalent to the thickness of the lead frame 28 also occurs without being clamped by the upper die 23 and the lower die 22. In normal resin cutting, these resin burrs are cut and removed. The width of the mold resin 27 in the portion of the runner 25 and the resin pool section 26 is larger than the width of these resin burrs. The thickness of the mold resin 27 is larger than the thickness of these resin burrs. Accordingly, the punch 31 of a resin cutting device is required to have high load capacity.

However, in some case, the punch 31 has no margin in load capacity and device load capacity is insufficient for convenience of mold die design. In some case, the punch 31 simultaneously comes into contact with both ends of the mold resin 27 to be resin-cut and a load from the punch 31 is not sufficiently applied. In these cases, it is likely that a crack 32 occurs from the root of the residual section 20, which is a cutting remainder after the resin cutting, to the mold forming section 17 and the semiconductor device is broken. It is also likely that a deficiency that the residual section 20 and the mold forming section 17 cannot be completely cut occurs. When the runner 25 is increased in length in order to prevent the crack 32 due to punching, since the residual section 20 remaining on the side surface of the mold forming section 17 increases in length, a product dimension is nonstandard. Therefore, it is necessary to perform punching in a position close to the mold forming section 17 to reduce the residual section 20 in length.

In contrast, in this embodiment, the dowel section 21 is provided between the inclined surface 18 and the residual section 20 on the third side surface 17c of the mold resin 14. Consequently, even if the punch 31 comes into contact with the dowel section 21 at resin cutting, the dowel section 21 is only broken as a dummy. The crack 32 does not occur in the mold forming section 17 of the mold resin 14. Position accuracy of the punch 31 is improved by performing the resin cutting with the dowel section 21 as a mark. As a result, a crack failure can be prevented.

The dowel section 21 is inclined in a direction in which the dowel section 21 is convex toward the residual section 20. Accordingly, even if the punch 31 comes into contact with the dowel section 21, since the punch 31 drops while slipping on the slope of the dowel section 21, the punch 31 can be positioned.

Second Embodiment

Figure 10:
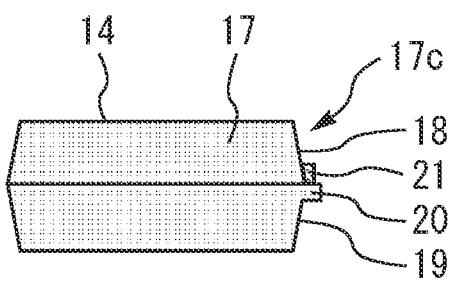
FIG. 10 is a side view illustrating a semiconductor device according to a second embodiment.
Figure 11:
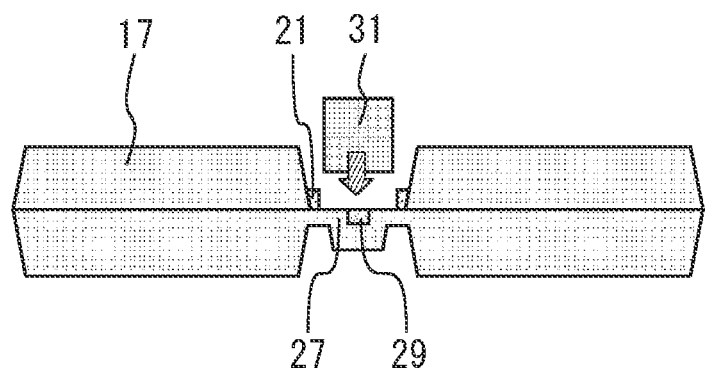
FIG. 11 is a side view illustrating a state of resin cutting of the semiconductor device according to the second embodiment.

FIG. 10 is a side view illustrating a semiconductor device according to a second embodiment. The dowel section 21 is inclined in the first embodiment. However, in this embodiment, the dowel section 21 has a plane perpendicular to the up-down direction. FIG. 11 is a side view illustrating a state of resin cutting of the semiconductor device according to the second embodiment. The mold resin 14 in the portion of the runner 25 is punched by the punch 31 after resin sealing. Even if the punch 31 comes into contact with the dowel section 21 at resin cutting, the dowel section 21 is only broken as a dummy and a crack does not occur in the mold forming section 17 of the mold resin 14. Position accuracy of the punch 31 is improved by performing the resin cutting with the dowel section 21 as a mark. As a result, a crack failure can be prevented.

Third Embodiment

FIGS. 12 to 16 are side views illustrating a method of manufacturing a semiconductor device according to a third embodiment. At a stage of resin sealing, the die pads 1 and 2, the power terminal 3, the IC terminal 4, and the lead 30 are one lead frame connected via the framework 29 and are not separated from one another. The power terminal 3, the IC terminal 4, and the lead 30 are punched by the punch 31 and cut from the framework 29.

Figure 12:
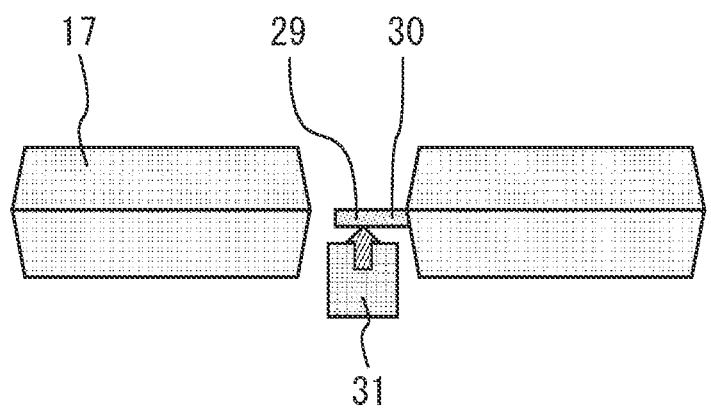
FIG. 12 is a side view illustrating a method of manufacturing a semiconductor device according to a third embodiment.
Figure 13:
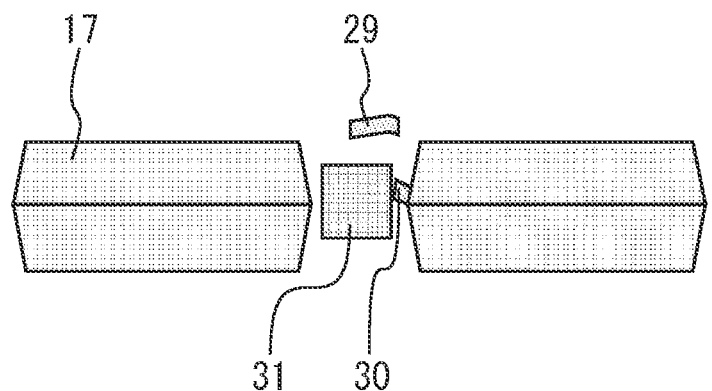
FIG. 13 is a side view illustrating a method of manufacturing a semiconductor device according to a third embodiment.

At this time, as illustrated in FIG. 12, the lead 30 is punched by the punch 31 from the lower surface side of the mold resin 14. Consequently, as illustrated in FIG. 13, the lead 30 includes a fracture surface having a return surface on the upper side. The lead 30 after cutting is not used for electric connection to the outside. Therefore, a projection amount of the lead 30 from the mold resin 14 is smaller than a projection amount of the power terminal 3 and the IC terminal 4. The lead 30 is provided in at least one of the first side surface 17a and the second side surface 17b on which the power terminal 3 and the IC terminal 4 are provided, a third side surface on which the residual section 20 and the dowel section 21 are provided, and a fourth side surface opposed to the third side surface.

Figure 14:
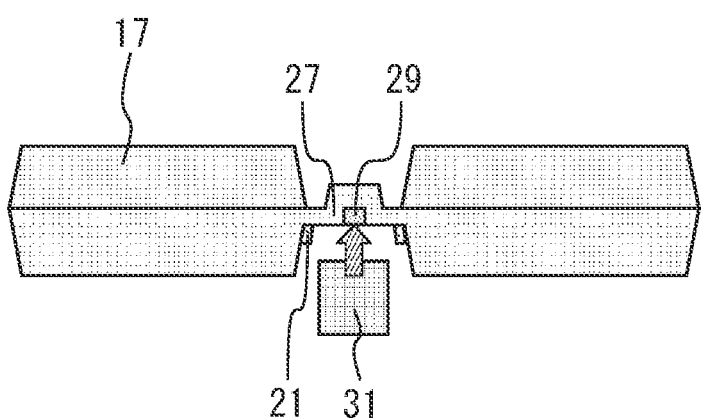
FIG. 14 is a side view illustrating a method of manufacturing a semiconductor device according to a third embodiment.
Figure 15:
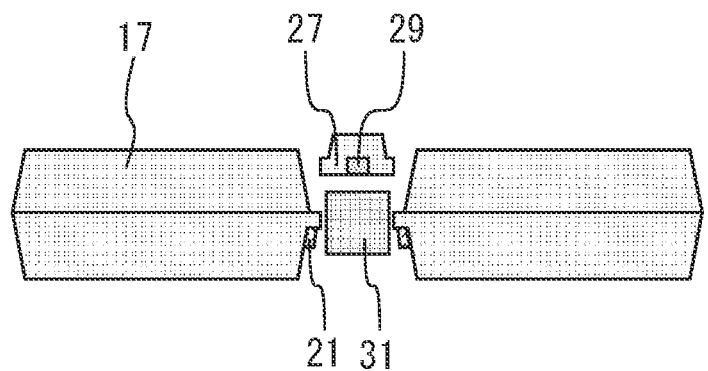
FIG. 15 is a side view illustrating a method of manufacturing a semiconductor device according to a third embodiment.
Figure 16:
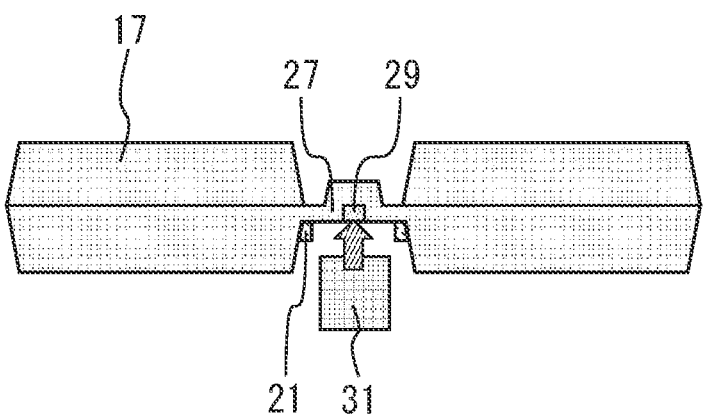
FIG. 16 is a side view illustrating a method of manufacturing a semiconductor device according to a third embodiment.

Regarding the resin cutting, as illustrated in FIGS. 14 and 15, the mold resin 14 in the portion of the runner 25 is punched by the punch 31 from the lower surface side of the mold resin 14. In this case, the dowel section 21 is provided on the lower side of the residual section 20. Consequently, a crack failure can be prevented. As illustrated in FIG. 16, the dowel section 21 having a plane perpendicular to the up-down direction may be used.

As illustrated in FIG. 1, the insulating film 15 and the metal foil 16, which are the insulating radiating material, are provided on the lower surfaces of the die pads 1 and 2, on which the semiconductor chips 5 and 6 are mounted, and exposed from the lower surface of the mold resin 14. The semiconductor device is mounted on a heat sink. Heat generated from the semiconductor chips 5 and 6 is radiated to the heat sink via the insulating radiating material. In this embodiment, since the fracture surface of the framework 29 has the return surface on the upper side, the distance between the distal end of the framework 29 and the heat sink can be secured. As a result, an increase in insulation can be achieved.

Fourth Embodiment

Figure 17:
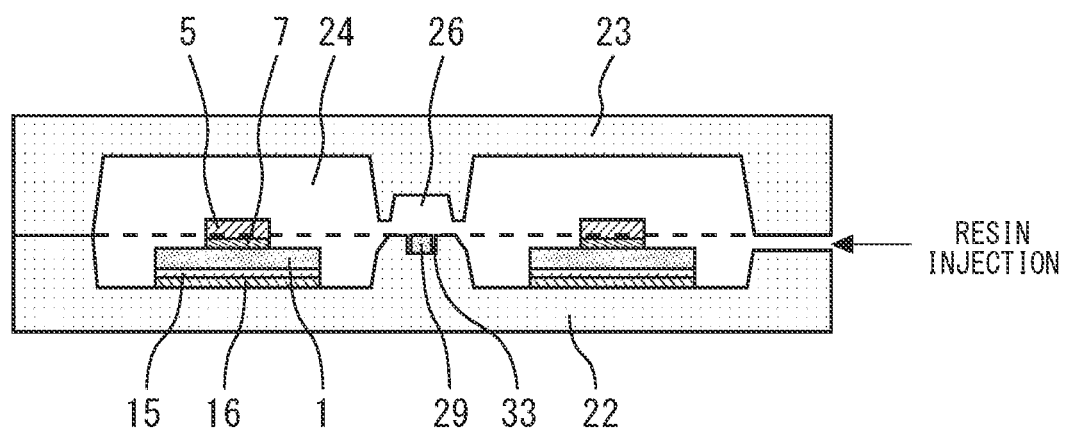
FIG. 17 is a side view illustrating a method of manufacturing a semiconductor device according to a fourth embodiment.
Figure 18:
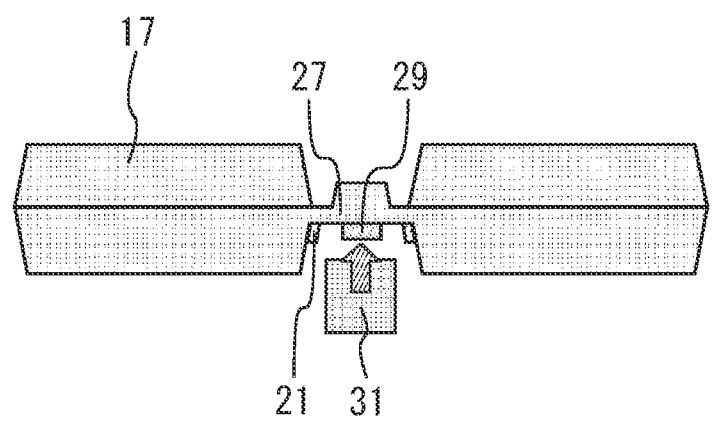
FIG. 18 is a side view illustrating a method of manufacturing a semiconductor device according to a fourth embodiment.
Figure 19:
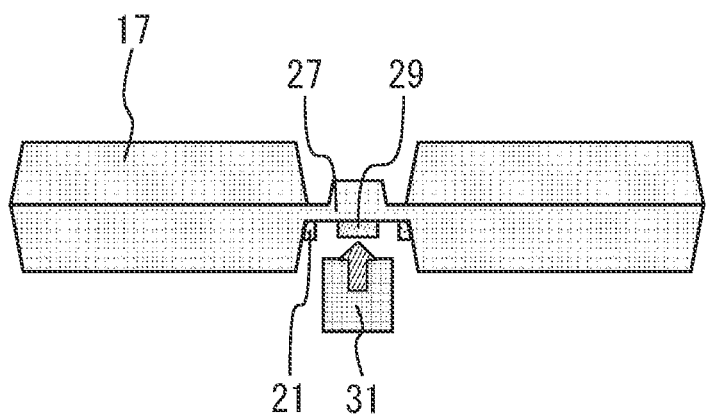
FIG. 19 is a side view illustrating a method of manufacturing a semiconductor device according to a fourth embodiment.

FIGS. 17 to 19 are side views illustrating a method of manufacturing a semiconductor device according to a fourth embodiment. As illustrated in FIG. 17, the framework 29 that supports the die pads 1 and 2, the power terminal 3, and the IC terminal 4 is disposed between two cavities 24 adjacent to each other. Since a filler is highly filled in the mold resin 14, if the framework 29 is disposed in the runner 25 or the resin pool section 26, it is likely that the filler is caught by a narrow gap and a product failure due to a delay of filling of the mold resin 14 or lack of the filling occurs. Therefore, in this embodiment, the framework 29 is put in a recess 33 provided in the lower die 22 and disposed outside the runner 25 and the resin pool section 26. Consequently, since an obstacle is absent when resin is flowing, fluidity of the resin can be stabilized.

After the resin sealing, as illustrated in FIG. 18, the mold resin 14 and the framework 29 in the portion of the runner 25 are punched by the punch 31 from the lower surface side of the mold resin 14. By providing the dowel section 21 on the lower side of the residual section 20, a crack failure can be prevented. As illustrated in FIG. 19, the dowel section 21 having plane perpendicular to the up-down direction may be used.

The semiconductor chips 5 and 6 are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-191511, filed on Nov. 25, 2021 including specification, claims, drawings and summary, on which the convention priority of the present application is based, is incorporated herein by reference in its entirety.

The invention claimed is:
1. A semiconductor device comprising:
a semiconductor chip;
a lead terminal connected to the semiconductor chip; and
insulative mold resin sealing the semiconductor chip and a part of the lead terminal,
wherein the mold resin includes a mold forming section having first and second side surfaces opposed to each other and a third side surface different from the first and second side surfaces,
the lead terminal projects from the first and second side surfaces, the third side surface includes inclined surfaces inclined in a direction in which a center in an up-down direction of the third side surface is convex, the mold resin further includes a residual section provided in the center of the third side surface and a dowel section provided between the inclined surface and the residual section, the dowel section projects further in a lateral direction than the inclined surface, and the residual section further projects in the lateral direction than the dowel section and has a fracture surface perpendicular to the up-down direction.

2. The semiconductor device according to claim 1, wherein the dowel section is inclined in a direction in which the dowel section is convex toward the residual section.

3. The semiconductor device according to claim 1, wherein the dowel section has a plane perpendicular to an up-down direction.

4. The semiconductor device according to claim 1, further comprising a lead projecting from at least one of side surfaces of the mold forming section, wherein a projection amount of the lead from the mold forming section is smaller than a projection amount of the lead terminal, and the lead includes a fracture surface having a return surface on an upper side.

5. The semiconductor device according to claim 4, further comprising a die pad on which the semiconductor chip is mounted, and an insulating radiating material provided on a lower surface of the die pad.

6. The semiconductor device according to claim 1, wherein the semiconductor chip is made of a wide-band-gap semiconductor.

7. A method of manufacturing a semiconductor device according to claim 1 comprising:

disposing the semiconductor chip and the lead terminal in each of a plurality of cavities of a die which are connected to each other by a runner;

supplying the mold resin to the plurality of cavities in order via the runner to seal the semiconductor chip and the lead terminal; and punching the mold resin in a portion of the runner by a punch so that the residual section is left.

8. The method of manufacturing a semiconductor device according to claim 7, wherein a framework disposed between the cavities adjacent to each other and supporting the lead terminal is disposed outside the runner.

* * * * *